(12) United States Patent
Chiu et al.

(10) Patent No.: US 10,818,575 B2
(45) Date of Patent: Oct. 27, 2020

(54) DATACENTER 3D SOLID STATE DRIVES WITH MATRIX COOLING

(71) Applicant: SANDISK INFORMATION TECHNOLOGY (SHANGHAI) CO., LTD., Shanghai (CN)

(72) Inventors: Chin-Tien Chiu, Taichung (TW); Zhongli Ji, Shanghai (CN); Hem Takiar, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/906,925

(22) Filed: Feb. 27, 2018

(65) Prior Publication Data

US 2019/0189536 A1    Jun. 20, 2019

(30) Foreign Application Priority Data

Dec. 20, 2017   (CN) .......................... 2017 1 1383612

(51) Int. Cl.
| | | |
|---|---|---|
| *H01L 23/46* | (2006.01) | |
| *H01L 25/065* | (2006.01) | |
| *H01L 23/467* | (2006.01) | |
| *H01L 23/367* | (2006.01) | |

(52) U.S. Cl.
CPC ............ *H01L 23/46* (2013.01); *H01L 23/467* (2013.01); *H01L 25/0652* (2013.01); *H01L 25/0657* (2013.01); *H01L 23/367* (2013.01); *H01L 2224/24145* (2013.01); *H01L 2224/32145* (2013.01); *H01L 2225/06517* (2013.01); *H01L 2225/06524* (2013.01); *H01L 2225/06565* (2013.01); *H01L 2225/06586* (2013.01); *H01L 2225/06589* (2013.01); *H01L 2924/1436* (2013.01); *H01L 2924/1438* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 5,150,274 A | 9/1992 | Okada et al. | |
| 5,923,533 A | 7/1999 | Olson | |
| 6,052,284 A * | 4/2000 | Suga ................... | H01L 23/473 361/699 |
| 6,686,654 B2 | 2/2004 | Farrar et al. | |
| 7,027,302 B2 | 4/2006 | Inoue | |
| 7,071,552 B2 | 7/2006 | Ravi et al. | |
| 7,586,747 B2 | 9/2009 | Salmon | |
| 7,727,807 B2 | 6/2010 | Han | |
| 8,247,895 B2 | 8/2012 | Haensch et al. | |
| 8,410,602 B2 | 4/2013 | Natarajan et al. | |

(Continued)

FOREIGN PATENT DOCUMENTS

EP    2023390    9/2015

*Primary Examiner* — Long Pham
(74) *Attorney, Agent, or Firm* — Vierra Magen Marcus LLP

(57) ABSTRACT

A solid state drive is disclosed including a planar array of semiconductor devices for use in a datacenter, and a system for cooling the planar array of semiconductor devices. The semiconductor devices may be arranged in a grid pattern, spaced apart from each other so as to define rows and columns of flow pathways, or cooling tunnels, around and between the semiconductor devices.

26 Claims, 12 Drawing Sheets

(56) References Cited

U.S. PATENT DOCUMENTS

| | | |
|---|---|---|
| 9,391,009 B2 | 7/2016 | Jang et al. |
| 2004/0245617 A1 | 12/2004 | Damberg et al. |
| 2008/0179736 A1 | 7/2008 | Hartwell et al. |
| 2015/0357260 A1 | 12/2015 | Ankireddi et al. |

* cited by examiner

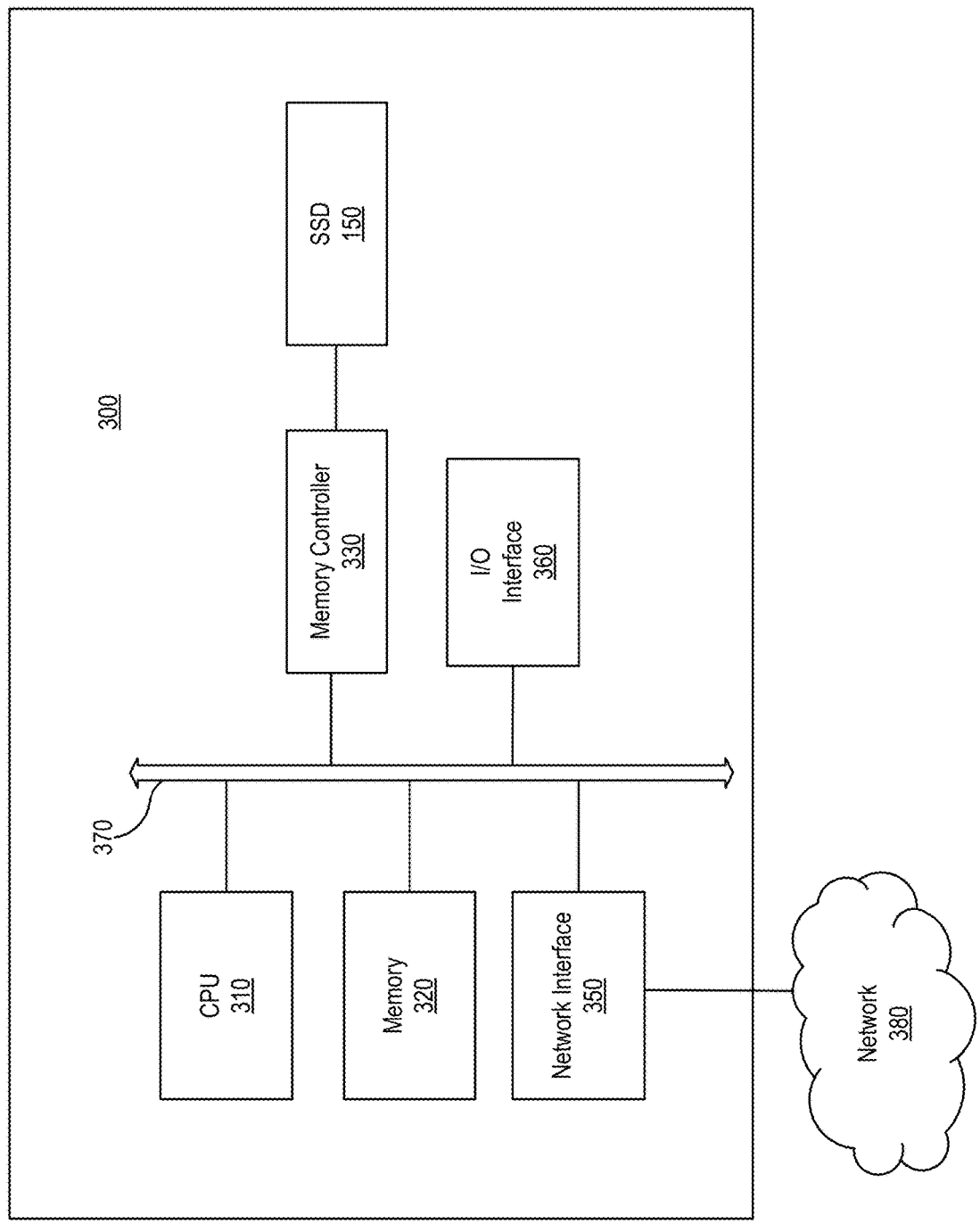

DATACENTER 3D SOLID STATE DRIVES WITH MATRIX COOLING

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Given the advantages of non-volatile memory devices, there is currently a push to use them as solid state drives (SSDs) in enterprise datacenters in the place of traditional hard disk drives (HDDs). In particular, because SSDs store data electronically and do not require the mechanical interface of an HDD, SSDs can read and write data more quickly than HDDs. Another feature of the electronic versus mechanical interface is that SSDs tend to last longer, and use less power for read/write operations.

The amount of data that is being generated on a daily basis is growing rapidly, placing more and more demand on datacenters. This presents two challenges for datacenter SSDs. First is storage capacity. With recent advances in SSD technology, SSD storage capacity has recently surpassed HDD storage capacity, and SSDs are scaling at a faster rate than HDDs. However, meeting data demands in enterprise datacenters remains a constant problem. The second challenge is cooling. The concentrated use of SSDs generate a large amount of heat in a closed space. The inability to efficiently cool enterprise datacenter SSDs limits the operational capabilities of such drives.

DESCRIPTION OF THE DRAWINGS

FIG. 17 is a block diagram of a computing environment such as a datacenter in which the solid state drive of the present technology may be implemented.

DETAILED DESCRIPTION

The present technology will now be described with reference to the figures, which in embodiments, relate to a solid state drive including a planar array of semiconductor devices for use in a datacenter, and a system for cooling the planar array of semiconductor devices. The semiconductor devices may be arranged in a grid pattern, spaced apart from each other so as to define rows and columns of flow pathways around and between the semiconductor devices. The planar array of semiconductor devices may be physically and electrically bonded on one major surface to a large substrate by a heat-pressure process. The planar array may be physically bonded on the opposed major surface to a cover. The pathways between the semiconductor devices, together with the substrate and cover, define cooling tunnels through which a cooling fluid may flow to carry heat away from the semiconductor devices in the planar array.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

Figure 1:
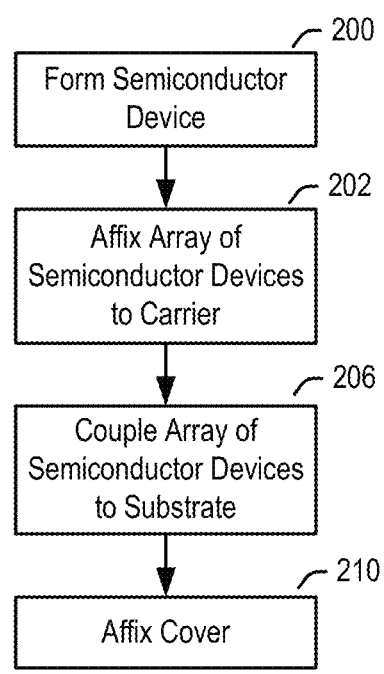
FIG. 1 is a flowchart of the overall fabrication process of a solid state drive according to embodiments of the present technology.
Figure 2:
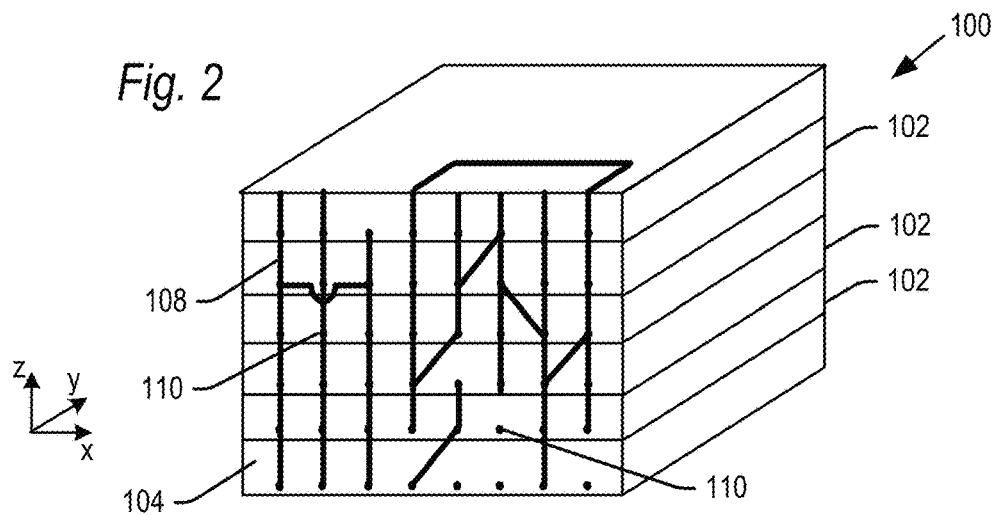
FIG. 2 is a perspective view of a 3-D cube semiconductor device according to an embodiment of the present technology.

An embodiment of the present technology will now be explained with reference to the flowchart of FIG. 1, and the views of FIGS. 2-16. The present technology begins with the formation of a plurality of semiconductor devices in step 200. One such semiconductor device 100 is shown in FIG. 2. In embodiments, the semiconductor device 100 may be 3-D cube semiconductor device where a footprint of the semiconductor device is equal to a footprint of the semiconductor die 102 used in the device 100.

The semiconductor device 100 may be fabricated using a plurality of stacked semiconductor die 102, each having die bond pads extending to an edge 104 of the device 100. This may be accomplished by having die bond pads which extend at least partially into the scribe area of the semiconductor wafer from which the semiconductor die 102 are formed. In such embodiments, the die bond pads may be severed when the die are cut from the wafer, leaving an edge of the die bond pads exposed at the edge 104. The die bond pads may be extended to the edge 104 of the die 102 by other means including redistribution layers (RDL) in further embodiments.

The die 102 may be stacked atop each other using a die attach film (DAF). Thereafter, a pattern of electrical traces 108 may be formed on the edge 104, using for example chemical or thin film deposition techniques, to electrically interconnect the die bond pads of respective die 102 at the edge 104 on different levels of the 3-D cube. The particular pattern shown is by way of example only and may vary in other embodiments. Lastly, solder bumps 110 may be deposited on the electrical traces 108, to electrically connect the semiconductor device 100 to a substrate as explained below.

The semiconductor die 102 in the device 100 may for example be NAND flash memory die, but may be other types of semiconductor die in further embodiments. The number of stacked semiconductor die 102 in device 100 may vary, but may be for example 2, 4, 8, 16 or 32 semiconductor die. There may be greater, fewer or other numbers of die 102 in the semiconductor device 100 in further embodiments. Additionally, while the embodiment shown includes a pattern of traces 108 on an edge 104 to electrically interconnect semiconductor die 102 in the device 100, the die 102 may be electrically interconnected by other methods in further embodiments, including for example by through silicon vias (TSV). Such vias may be connected to the solder bumps 110. While the semiconductor device 100 may be a 3-D cube in embodiments, the semiconductor device 100 may be other types of system in a package (SIP) semiconductor devices in further embodiments.

Figure 3:
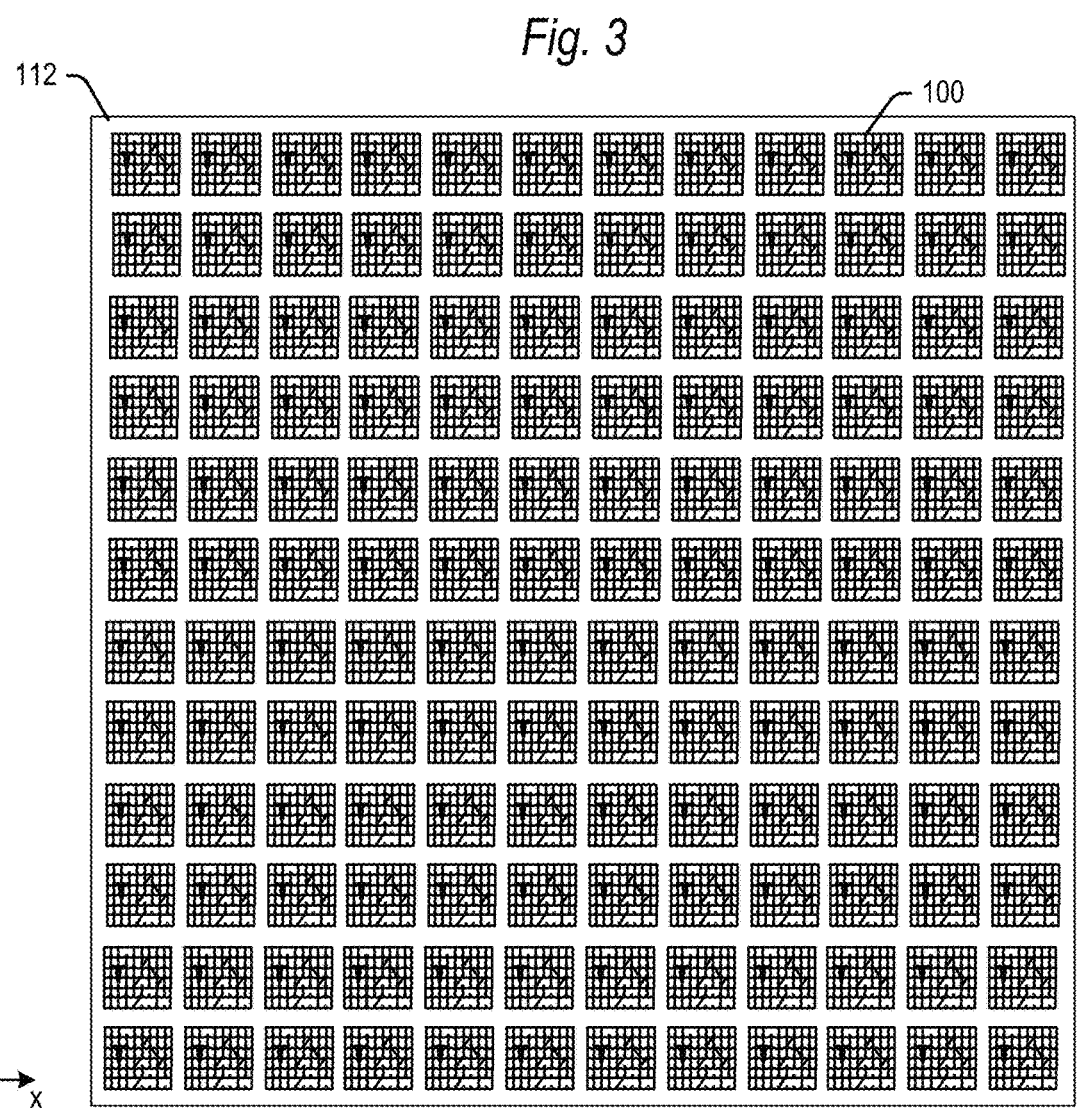
FIG. 3 is a top view of an array of semiconductor devices affixed to a carrier according to an embodiment of the present technology.
Figure 4:
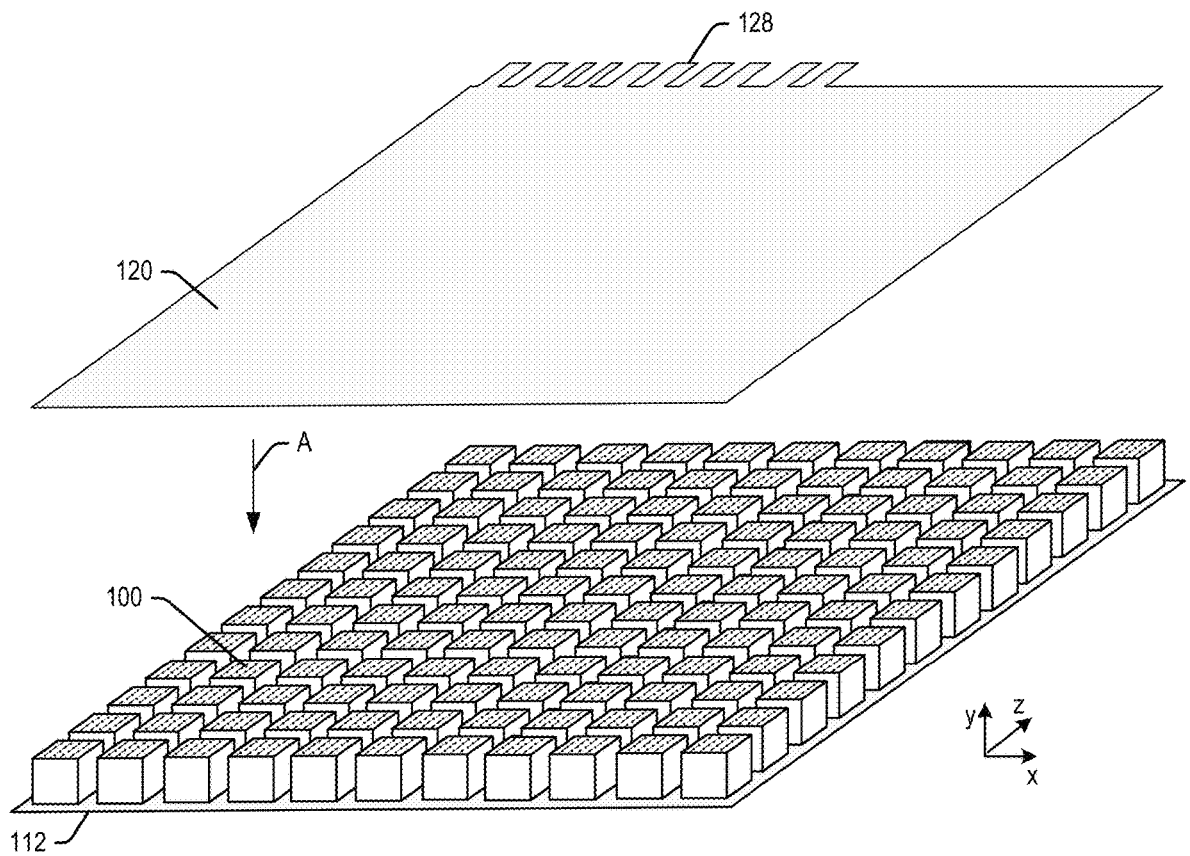
FIG. 4 is a perspective view of a substrate to be mounted on an array of semiconductor devices according to embodiments of the present technology.

In step 202, a number of semiconductor devices 100 as shown in FIG. 2 may be tacked or otherwise temporarily affixed in a grid pattern on a chuck or carrier 112 as shown in FIGS. 3 and 4. The devices 100 may be affixed such that the edge 104 including the solder bumps 110 may face upward, away from the carrier 112. In embodiments, the semiconductor devices 100 may be arranged in parallel rows (in the x-direction) and parallel columns (in the y-direction) to form a uniform grid pattern with spaces between semiconductor devices 100 in each row and each column. As explained below, this uniform grid pattern of spaced semiconductor devices 100 creates fluid flow pathways, referred to herein as cooling tunnels, between the semiconductor devices 100 for cooling the devices 100. In one example, there may be twelve rows and twelve columns. However, the number of rows and columns may vary in further embodiments, proportionately or disproportionately with each other.

Figure 5:
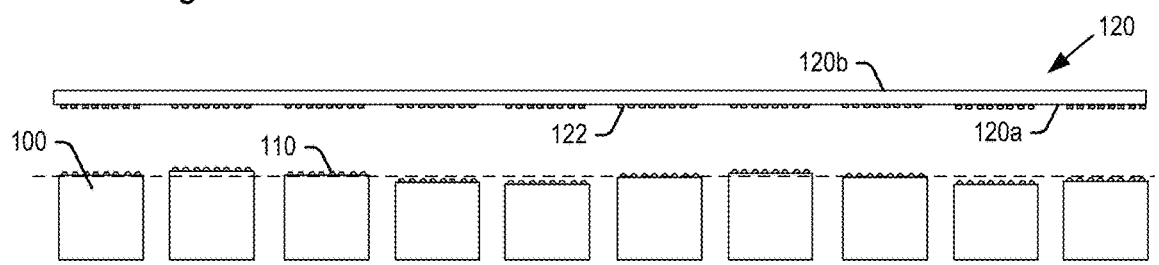
FIG. 5 is an edge view of a substrate to be mounted to an array of semiconductor devices according to embodiments of the present technology.

In step 206, a substrate 120 (FIG. 4) may be physically and electrically coupled to the semiconductor devices 100 on the carrier 112. The substrate 120 may function as a signal communication means for transferring signals to and from the plurality of semiconductor devices 100. The substrate may include a surface 120a including a pattern of contact pads 122 (some of which are shown in FIG. 5). The substrate 120 may further include a pattern of traces and vias (not shown) for electrically connecting the contact pads 122 with an I/O connector 128 explained below.

The contact pads 122 are provided in a pattern to mate with the solder bumps 110 of the array of semiconductor devices 100. In particular, the substrate 120 is applied to the array of semiconductor devices 100 under pressure and elevated temperature to physically and electrically couple each of the semiconductor devices 100 to the substrate 120. In embodiments, each of the semiconductor devices 100 may be bonded to contact pads 122 of the substrate 120 at the same time. In embodiments, the semiconductor devices 100 and substrate may be heated to a temperature of for example 260° C., and the substrate 120 may be lowered (in the direction of arrow A, FIG. 4) onto the upper surface of the semiconductor devices 100 including the solder bumps 110. A pressure may be exerted onto a surface 120b of substrate 120. The elevated temperature and pressure may be applied over a period of time such as for example 5 seconds. This time and temperature is sufficient to reflow the solder bumps 110 and achieve copper diffusion between the solder bumps and the contact pads to make all connections between the semiconductor devices 100 and the substrate 120. It is understood that each of the temperature, pressure and time period set forth above may vary in further embodiments. As one further example, the semiconductor devices 100 and substrate 120 may be heated to a temperature of 100° C. for a period of one hour.

Ideally, each of the semiconductor devices 100 has a uniform height such that the upper surface including the solder bumps 110 lies in a single plane to uniformly bond to the planar surface of the substrate 120 including the contact pads 122. However, in practice, given tolerances in the fabrication of the semiconductor devices 100, the solder bumps 110 on respective devices 100 may not all be coplanar, as shown for example in FIG. 5. Accordingly, in embodiments, the substrate 120 may be sufficiently pliable so that, under a hydraulic pressure, the substrate 120 may couple with the solder bumps on each of the semiconductor devices 100, even where the devices 100 have different heights, as shown in the edge view of FIG. 6.

Figure 6:
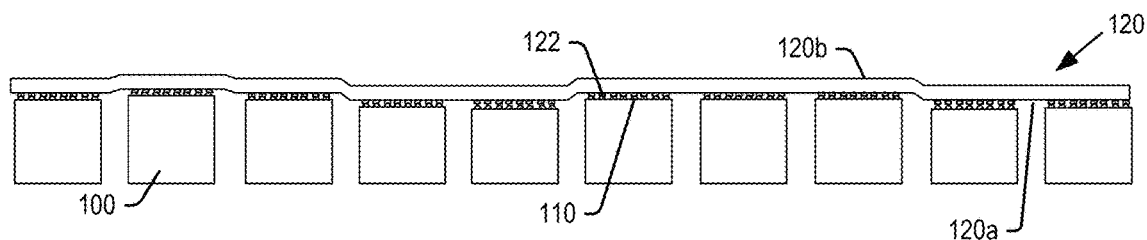
FIGS. 6-8 are edge views of a substrate mounted to an array of semiconductor devices according to embodiments of the present technology.
Figure 7:
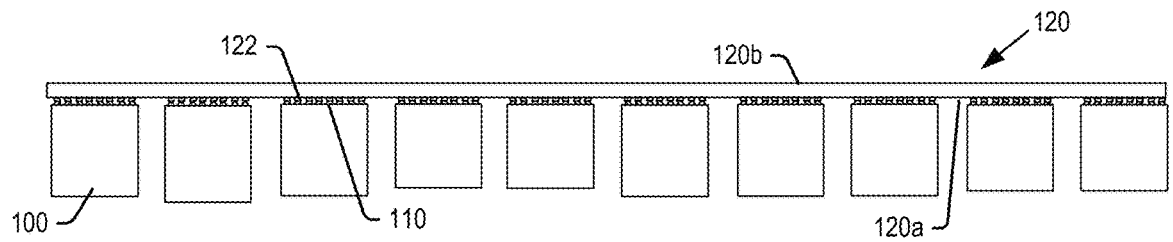

Use of hydraulic pressure and a pliable substrate 120 allows uniform downward forces on the substrate 120 even where the substrate has deformed to contact semiconductor devices 100 of different heights as shown in FIG. 6. It is conceivable that the substrate 120 may be rigid. In such embodiments, each of the semiconductor devices 100 may be individually forced upward, for example under hydraulic pressure on a bottom of the semiconductor devices 100, to contact the rigid substrate 120 as shown in FIG. 7. In the embodiment of FIG. 7, the substrate may remain planar and connect to each of the semiconductor devices 100, even where the semiconductor devices 100 have different heights.

Figure 8:
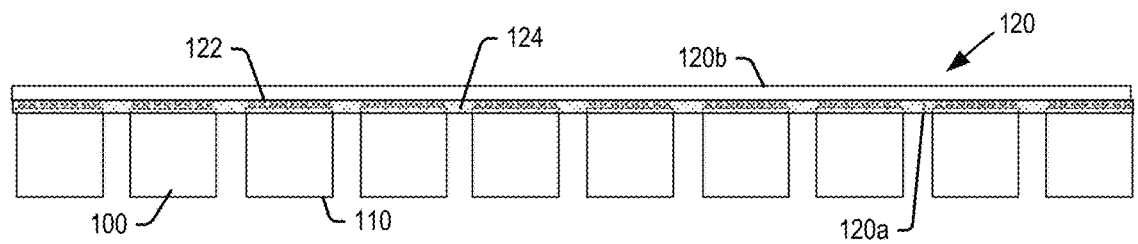

As shown in FIG. 8, a film layer 124 may be provided at the interface between the solder bumps 110 and contact pads 122 so that all such electrical connections are embedded within the film layer 124. As explained below, a cooling fluid may be injected around the semiconductor devices 100, and the film layer 124 electrically isolates the electrical connections. Film layer 124 may be formed of various epoxies as known in the art.

Figure 9:
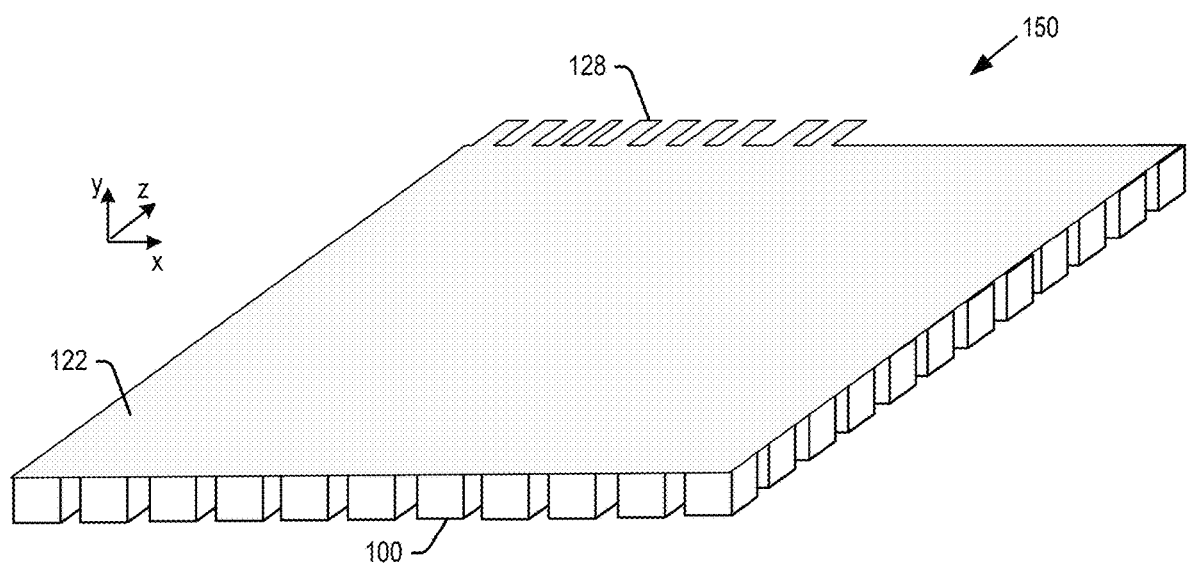
FIG. 9 is a perspective view of a solid state drive according to an embodiment of the present technology.

FIG. 9 shows the substrate 120 connected to the planar array of semiconductor devices 100 to form a solid state drive (SSD) 150. The substrate 120 may include an input/output (I/O) connector 128 for connecting the SSD 150 to a host device, such as for example a computer, printed circuit board or backplane. The I/O connector 128 is shown schematically in the figures, and may have any of a wide variety of configurations for connecting the SSD 150 to a host device.

Figure 10:
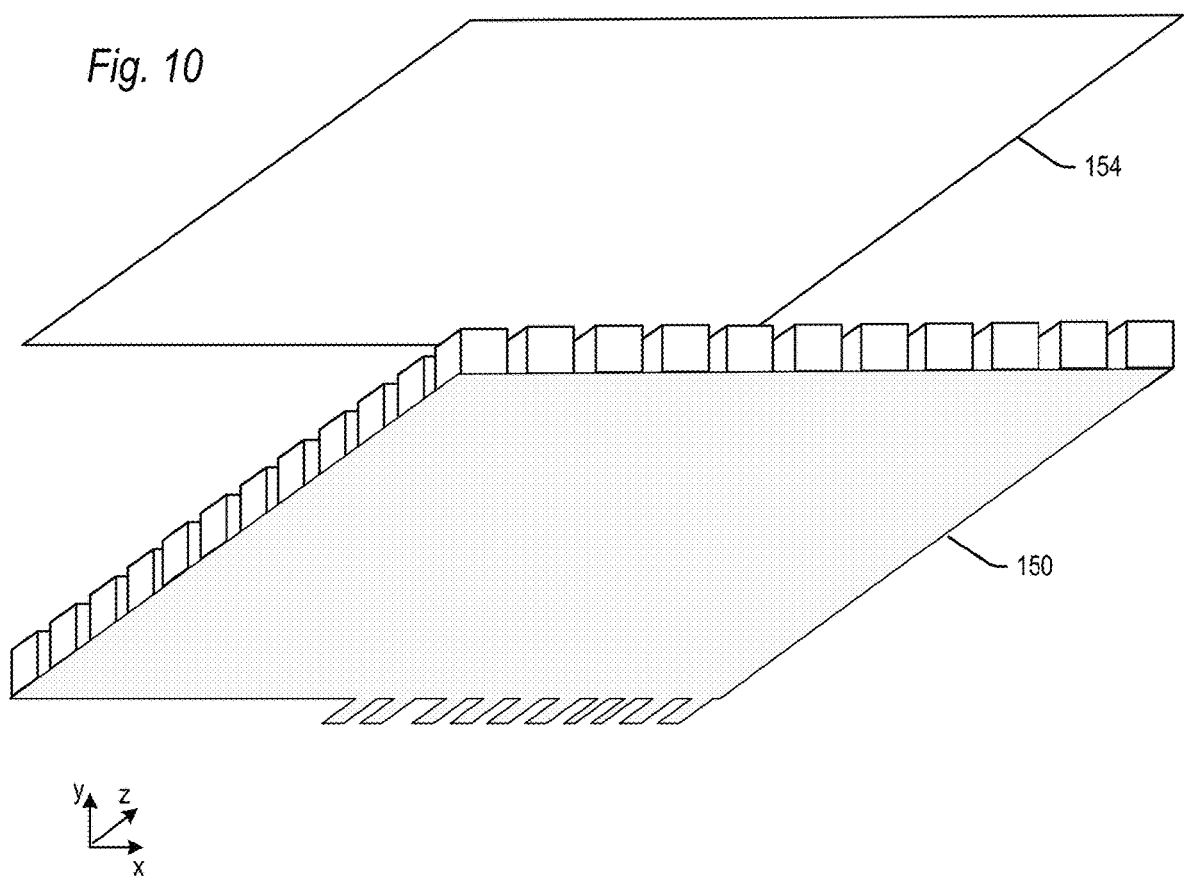
FIG. 10 is a bottom perspective view of a cover to be mounted on a solid state drive according to embodiments of the present technology.

FIG. 10 is a bottom perspective view of the SSD 150. FIG. 10 further illustrates a cover 154 which may be affixed to the SSD 150 in a step 210. The cover 154 may be a substantially rigid, planar sheet, formed for example of a metal or other heat conductor to facilitate the removal of heat from the semiconductor devices 100. The cover may be formed of plastic or other materials in further embodiments. The cover 154 may be affixed to the SSD 150 with an epoxy or other adhesive.

Figure 11:
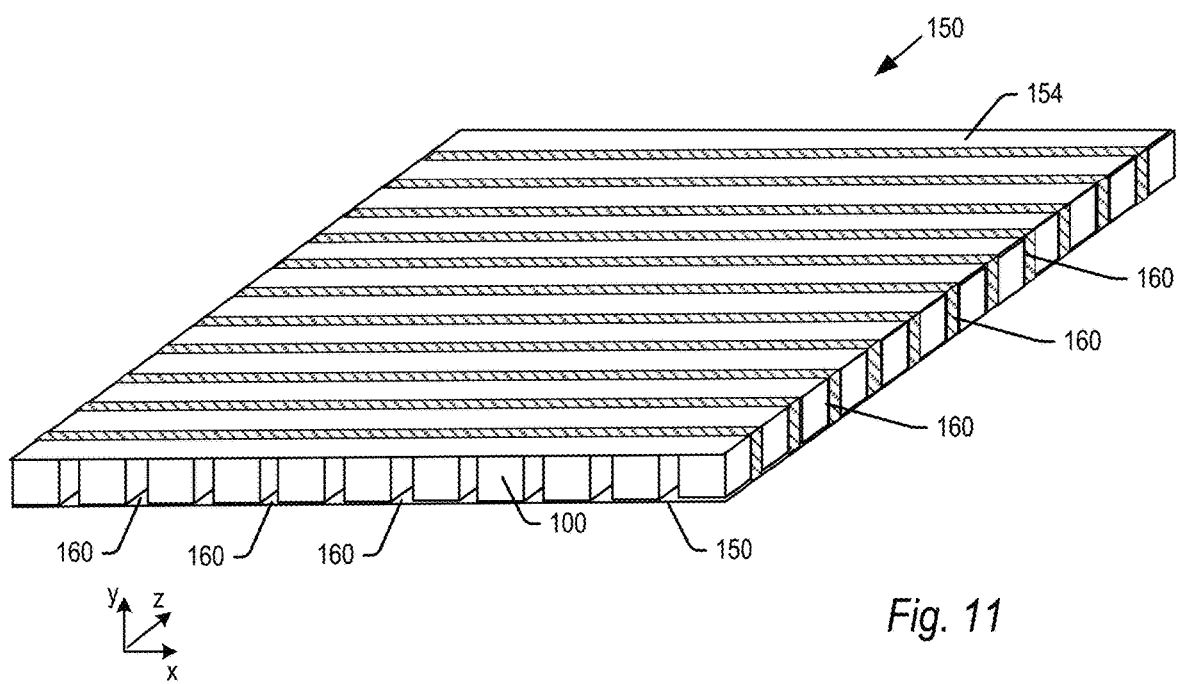
FIG. 11 is a perspective view of a solid state drive showing cooling tunnels according to an embodiment of the present technology.

FIG. 11 is a top perspective view showing the SSD 150 including substrate 120, semiconductor devices 100 and cover 154. As noted above, the semiconductor devices 100 may be arranged in parallel rows and columns with spaces therebetween to define cooling tunnels 160 (some of which are numbered in FIG. 11) that extend in the x direction and in the z direction, using the frame of reference provided on the figures. FIG. 11 shows the cooling tunnels extending across the SSD 150 in the x-direction. It is understood that, while shown in FIG. 11 for illustrative purposes, the cooling tunnels would in fact be enclosed within the SSD 150. Only the openings of the cooling tunnels 160 would be visible at the edges of the SSD 150, around a perimeter of the SSD 150.

Figure 12:
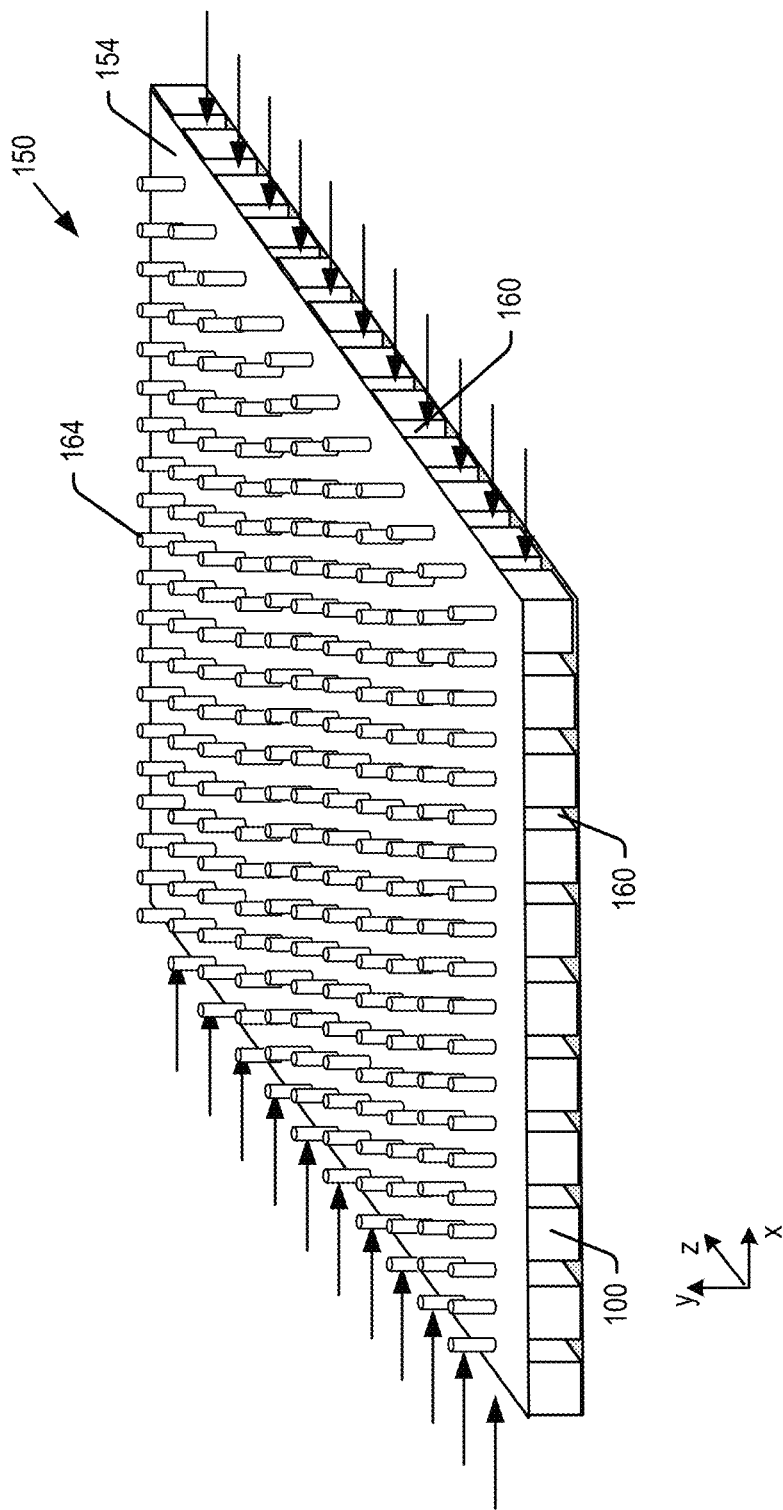
FIG. 12 is a perspective view of a solid state drive showing fluid flow through cooling tunnels and fluid tubes according to an embodiment of the present technology.

In accordance with further aspects of the present technology, a cooling fluid may be injected into the cooling tunnels 160 at one edge of the SSD 150, at two opposed edges of the SSD 150, at two adjacent edges of the SSD 150, or around all four edges of the SSD 150. FIG. 12 illustrates an embodiment where a cooling fluid is injected into the SSD 150 at opposed edges along the x-direction. The cooling fluid may be introduced evenly (i.e., with the same force) along an entire edge. Alternatively, the cooling fluid may be introduced unevenly along an edge, such as for example with a greater force toward a middle portion of the edge. In the embodiment of FIG. 12, the cooling fluid may be air or other gas, forced into the cooling tunnels 160 at opposed edges of the SSD 150 by a pair of fans (not shown) positioned adjacent the opposed edges of the SSD 150.

The embodiment of FIG. 12 further shows fluid tubes 164 extending through the cover 154 into communication with the cooling tunnels 160. Fluid injected into the opposed edges carries heat away from the semiconductor devices 100 by convection and then exits the SSD 150 through the fluid tubes 164. While FIG. 12 shows fluid entering from opposed edges, the fluid may enter from any of the one or more edges as described above. The cooling fluid may be continuously injected into the edges of the SSD 150 to continuously carry heat away from the semiconductor devices 100 during operation of the SSD 150. Alternatively, cooling fluid may be injected into the edges of the SSD 150 periodically as needed to cool the semiconductor devices 100.

The fluid tubes 164 may have an inner diameter of for example ¼ inch to ½ inch, though the inner diameter may be larger or smaller than that in further embodiments. The tubes 164 may have a length of 1 to 4 inches above the cover 154 of SSD 150, though the tubes may be longer or shorter than that in further embodiments. In one example, the fluid tubes 164 may be evenly distributed across the cover 154 and the total number of fluid tubes 164 may vary so long as the number of tubes and the diameter of the tubes are sufficient to allow the amount of fluid exiting the SSD 150 to be greater than or equal to the amount of fluid entering the SSD 150 from the one or more edges. The fluid tubes 164 may be positioned over the cooling tunnels 160 extending in the x-direction, over the cooling tunnels 160 extending in the z-direction and/or at junctions where the x-direction cooling tunnels meet the z-direction cooling tunnels.

FIG. 12 shows cooling fluid entering opposed edges of the SSD 150 in the x-direction and exiting out of the fluid tubes 164 in the cover 154. In further embodiments, the cooling fluid may enter opposed edges of the SSD 150 in the z-direction and exit out of the fluid tubes 164. In still further embodiments, the cooling fluid may be injected in a cyclically repeating sequence, first being injected through a first pair of opposed edges, and then being injected through the second pair of opposed edges. In still further embodiments, the working fluid may be injected through a first edge, then through a second edge, then through a third edge, then through the fourth edge, in succession, in some cyclically repeating pattern.

In embodiments, the fluid tubes 164 may vent to ambient. However, in further embodiments, the fluid tubes 164 may be connected to a vacuum or other low pressure source (not shown) to pull the fluid out through the fluid tubes 164. In embodiments, all of the fluid tubes 164 may be connected to the same low pressure source, or pressure sources having the same pressure. In further embodiments, the fluid tubes 164 connected to different low pressure sources applying different pressures. For example, the negative pressure source(s) toward a center of the SSD 150 may apply a more negative, or stronger, negative pressure than the pressure source(s) closer to the edges of SSD 150.

In still further embodiments, cooling fluid may instead be injected through the fluid tubes 164 in cover 154 and exit the SSD 150 through one or more edges. In further embodiments, the fluid tubes 164 may be omitted. In such embodiments, fluid may be injected into one or more edges, and exit the SSD 150 through the remaining edges.

Figure 13:
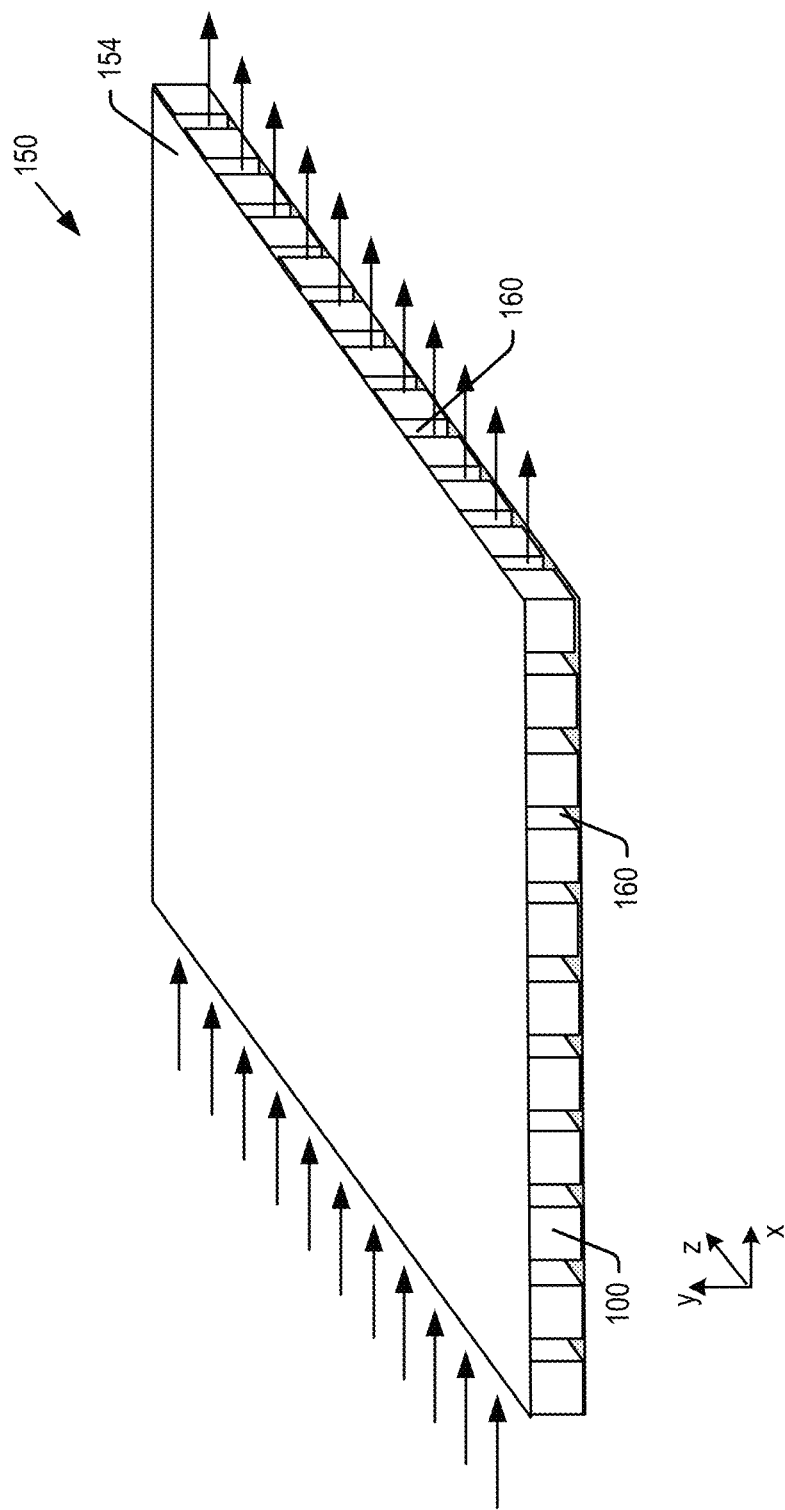
FIG. 13 is a perspective view of a solid state drive showing fluid flow through cooling tunnels according to an embodiment of the present technology.

As noted above, the cooling fluid used with the fluid tube embodiment of FIG. 12 may be air or other gas. While surface tension of a liquid may make liquid suboptimal for use with a fluid tube embodiment, the cooling fluid may be a liquid in further embodiments. FIG. 13 illustrates an embodiment which may be better suited for a cooling fluid such as deionized water or other liquid. In the embodiment of FIG. 13, the cooling fluid may be injected into one edge of the SSD 150, travel through the cooling tunnels 160, and the exit the opposed edge of the SSD 150. The working fluid may travel in the x-direction as shown or alternatively in the z-direction. As above, the fluid may be injected into any of the one or more edges, either simultaneously, or in succession in some cyclically repeating pattern. The cooling fluid may alternatively be a gas the embodiment of FIG. 13.

Figure 14:
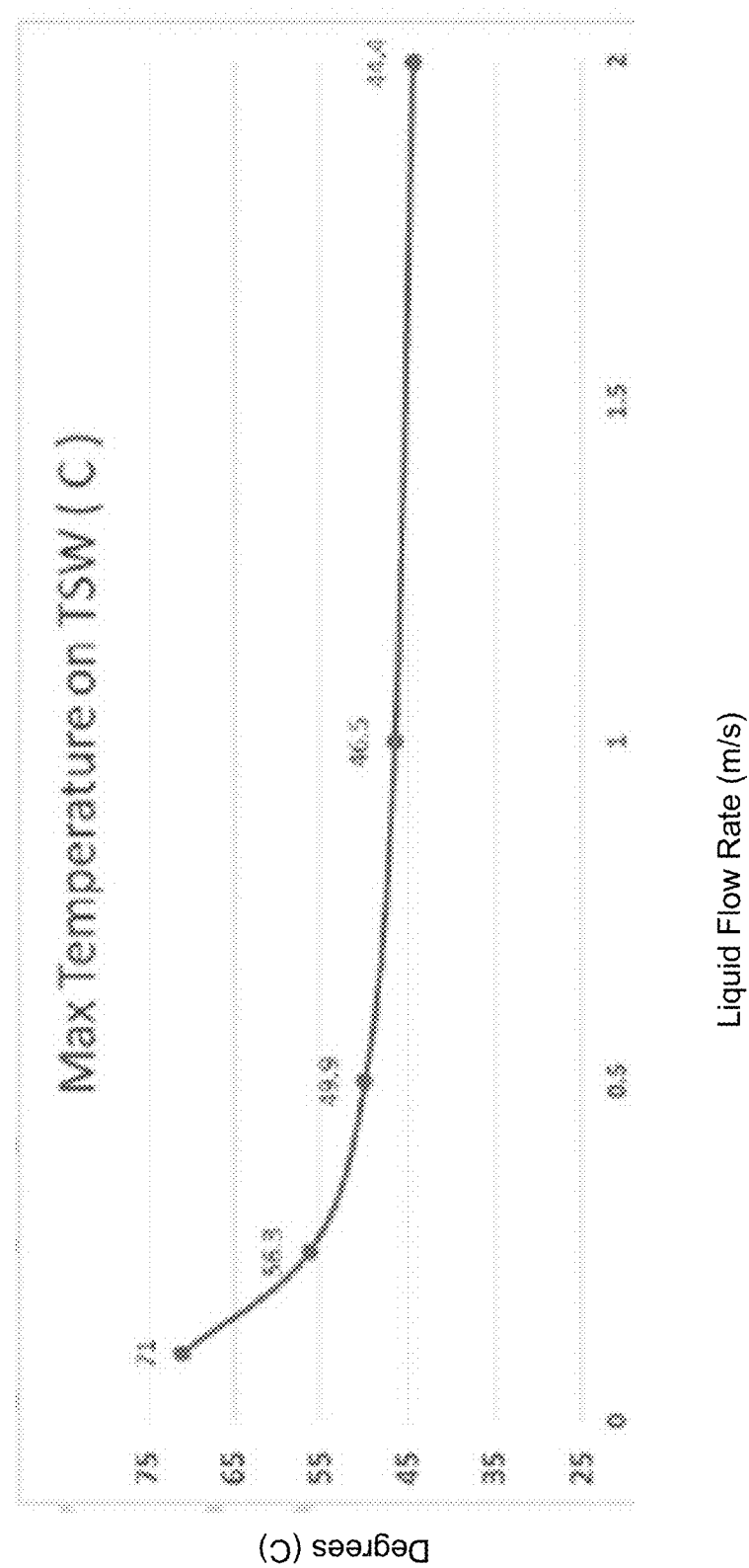
FIG. 14 is a graph of temperature versus fluid flow rate for a solid state drive including cooling tunnels according to embodiments of the present technology.
Figure 15:
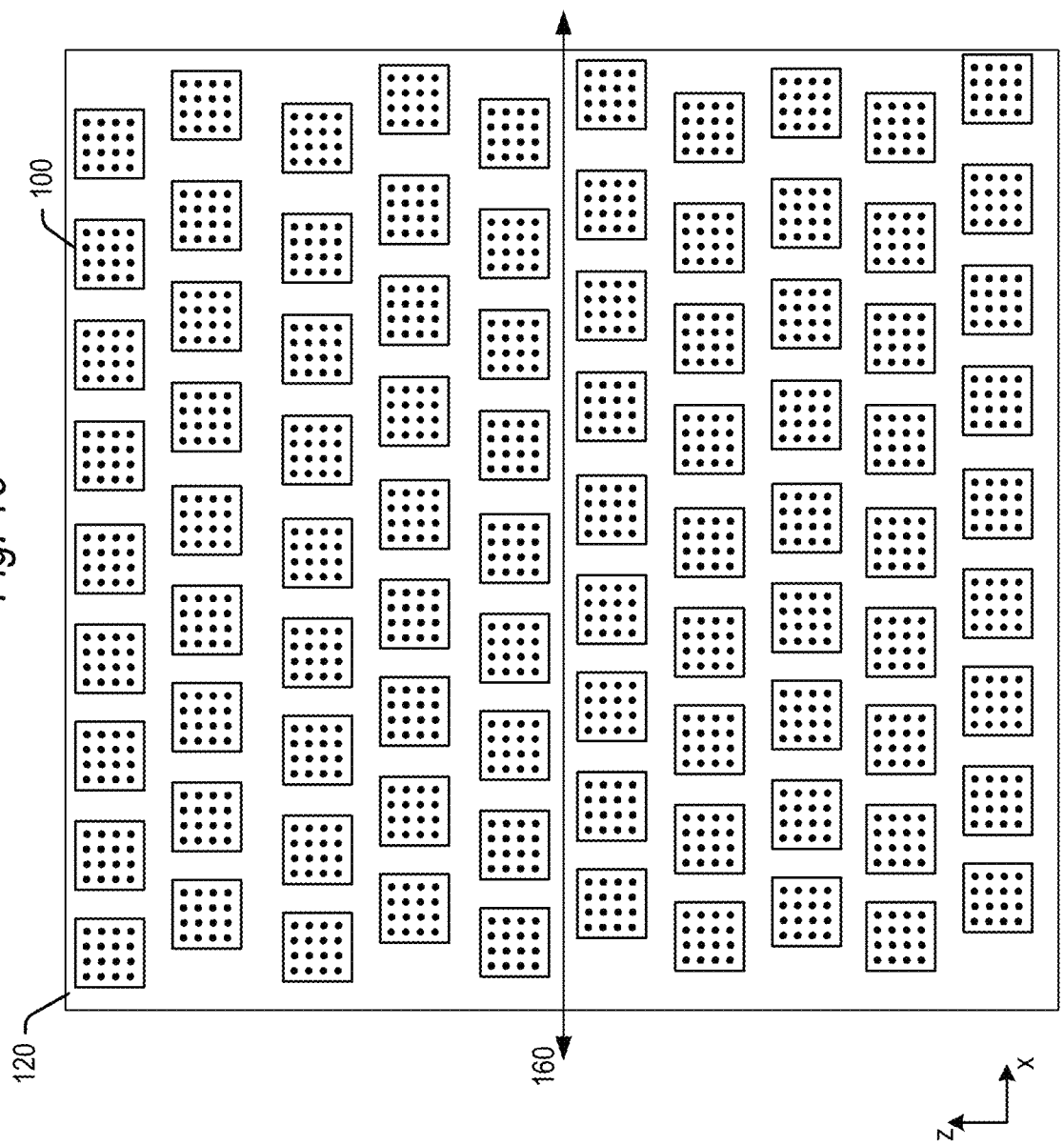
FIGS. 15 and 16 are top views of an array of semiconductor devices defining cooling tunnels according to an alternative embodiment of the present technology.

FIG. 14 is a graph of an example showing cooling of the semiconductor devices 100 in the embodiment of FIG. 13 with a liquid cooling fluid and with the SSD 150 generating 1800 Watts of power. The embodiment shows sample flow rates of between 0.1 m/s and 2 m/s, and the maximum temperatures of semiconductor devices 100 in the SSD 150 using such fluid flow rates. The graph shows the following flow rates and corresponding temperatures:

| Flow Rate | Temp (Max) (C.) |
| --- | --- |
| 0.1 | 71.0 |
| 0.25 | 56.3 |
| 0.5 | 49.0 |
| 1.0 | 46.5 |
| 2.0 | 44.4 |

These temperatures are well below the maximum temperatures for the operation of high density solid state drives within a datacenter. The above-described maximum temperatures would most typically occur at the edge of the SSD 150 where the cooling fluid exits the SSD 150.

In the embodiments described above, the semiconductor devices 100 were arrayed in parallel rows and columns to define cooling tunnels 160 extending in two orthogonal directions. In further embodiments, the semiconductor devices 100 may be arrayed in parallel rows or columns, but not both. Such an embodiment shown for example in FIG. 15. In the illustrated example, the devices 100 are aligned in rows, but not columns, so that a cooling fluid could travel along cooling tunnels 160 through the SSD 150 oriented in the x-direction. The semiconductor devices could alternatively be arrayed to align the cooling tunnels 160 in the z-direction. In further embodiments, it is conceivable that semiconductor devices 100 are not aligned across rows and are also not aligned across columns. Such an embodiment would include cooling tunnels 160 which are not straight.

Figure 16:
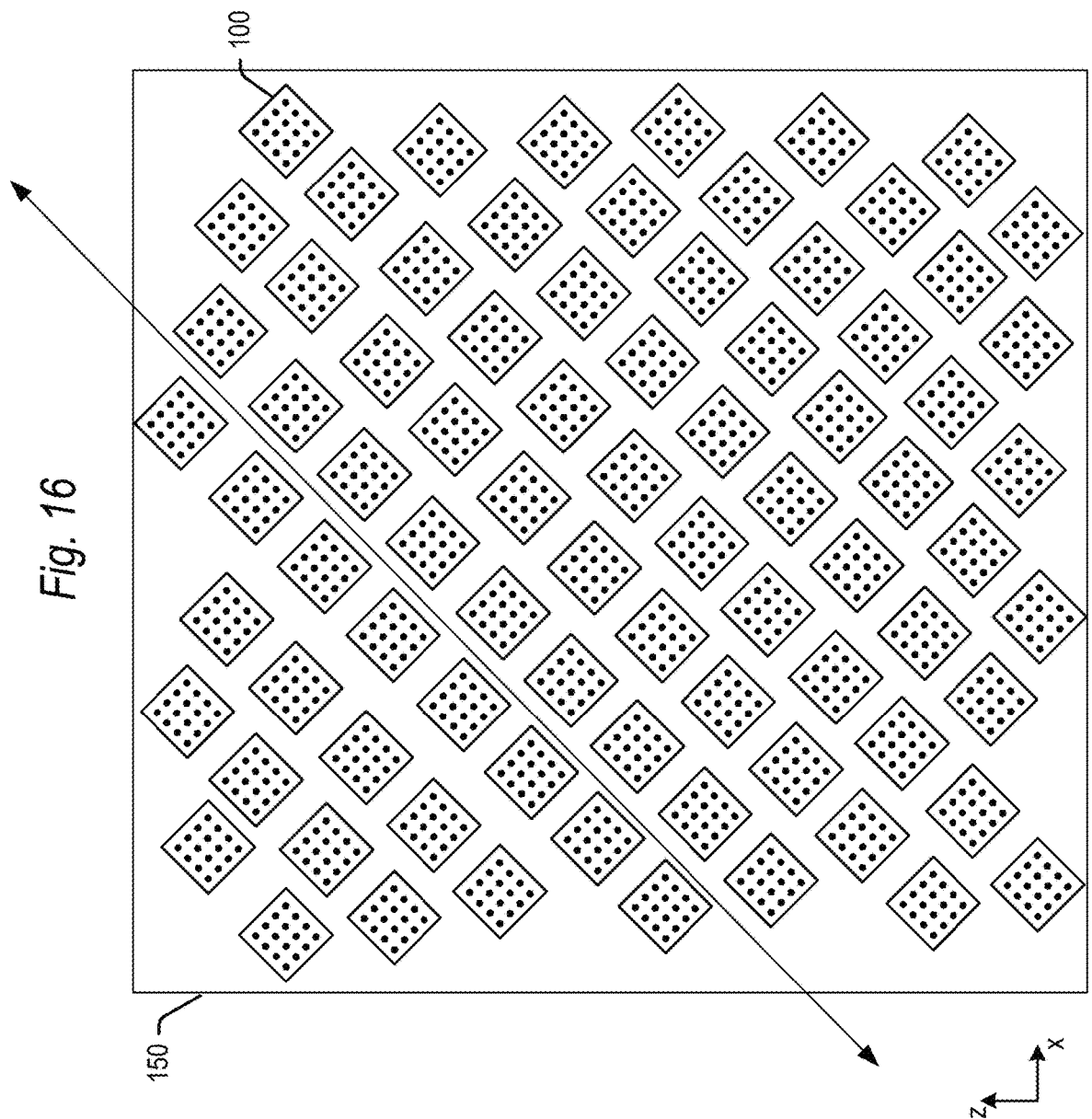

In the embodiments described above, the edges of the semiconductor devices 100 were at least generally parallel to the edges of the SSD 150. However, as shown in FIG. 16, the axes of the respective semiconductor devices 100 need not be parallel to the edges of the SSD 150. In such embodiments, the cooling tunnels 160 would form oblique angles to the edges of the SSD 150. Additionally, while the semiconductor devices 100 are shown extended to the edges of the substrate 120 and cover 154, it is understood that the edges of the substrate 120 and/or the cover 154 may extend out beyond the footprint of the semiconductor devices at one edge, two opposed or adjacent edges, three edges or all four edges in further embodiments.

In the embodiments described above, the cover 154 is directly affixed to the surfaces of the semiconductor devices 100 on a side of the semiconductor devices opposite to the substrate 120. In a further embodiment, the cover 154 may be supported over, and slightly spaced, from the surfaces of the semiconductor devices 100. In such an embodiment, the cooling fluid would flow through the cooling tunnels 160 as described above, but would also flow over the surfaces of the semiconductor devices 100 adjacent (but spaced from) the cover 154. Such an embodiment would increase the surface area of the semiconductor devices in direct contact with the cooling fluid and may improve the withdrawal of heat away from the semiconductor devices. The cover 154 could be supported over the semiconductor devices by posts extending from the cover 154 and anchored to the substrate 120 or the semiconductor devices 100. In this embodiment, the cover may be spaced from the semiconductor devices 1 mm to 5 mm, though the spacing may be more or less in further embodiments.

FIG. 17 is a block diagram of a computing environment, such as a datacenter 300, in which the SSD 150 may be used. Specific network devices may utilize all of the components shown, or only a subset of the components, and levels of integration may vary from device to device. Furthermore, the datacenter 300 may contain multiple instances of a component, such as multiple SSDs 150, and multiple processing units, transmitters, receivers, etc. The datacenter 300 may comprise a central processing unit (CPU) 310, a memory 320, a mass storage device which can be SSD 150 described above, and an I/O interface 360 connected to a bus 370. The bus 370 may be one or more of any type of several bus architectures including a memory bus or memory controller, a peripheral bus or the like.

The CPU 310 may comprise any type of electronic data processor. The memory 320 may comprise any type of system memory such as static random access memory (SRAM), dynamic random access memory (DRAM), synchronous DRAM (SDRAM), read-only memory (ROM), a combination thereof, or the like. In an embodiment, the memory 320 may include ROM for use at boot-up, and DRAM for program and data storage for use while executing programs. In embodiments, the memory 320 is non-transitory. The SSD 150 may communicate with the CPU 310 and other components via a memory controller 330.

The datacenter 300 may also include one or more network interfaces 350, which may comprise wired links, such as an Ethernet cable or the like, and/or wireless links to access nodes or one or more networks 380. The network interface 350 allows the datacenter 300 to communicate with remote units via the networks 380. For example, the network interface 350 may provide wireless communication via one or more transmitters/transmit antennas and one or more receivers/receive antennas. In an embodiment, the processing unit 301 is coupled to a local-area network or a wide-area network for data processing and communications with remote devices, such as other processing units, the Internet, remote storage facilities, or the like.

In summary, in one example, the present technology relates to a solid state drive, comprising: a substrate; a plurality of semiconductor devices coupled to the substrate and arrayed in at least one of spaced apart rows and columns of semiconductor devices; a plurality of cooling tunnels being defined by the at least one of spaced apart rows and columns of semiconductor devices, the plurality of cooling tunnels configured to receive a cooling fluid flowing through the cooling tunnels to carry heat away from the plurality of semiconductor devices.

In a further embodiment, the present technology relates to a solid state drive, comprising: a substrate; a plurality of semiconductor devices having first surfaces coupled to the substrate; a cover affixed to second surfaces of the plurality of semiconductor devices, the second surfaces being opposed to the first surfaces; and a plurality of cooling tunnels extending from a first edge of the solid state drive to a second edge of the solid state drive, each cooling tunnel of the plurality of cooling tunnels being defined by the substrate, cover, a first group of the plurality of semiconductor devices and a second group of the plurality of semiconductor devices, wherein the first and second groups semiconductor devices are aligned adjacent to each other and extend between the first edge and the second edge of the solid state drive, the plurality of cooling tunnels configured to receive a cooling fluid to remove heat from the plurality of semiconductor devices.

In another embodiment, the present technology relates to a method of cooling a solid state drive, comprising: (a) mounting a plurality of semiconductor devices between a substrate and a cover so that the plurality of semiconductor devices, substrate and cover the define a plurality of cooling tunnels; and (b) inducing fluid flow through the plurality of cooling tunnels to remove heat from the plurality of semiconductor devices.

In a still further embodiment, the present technology relates to a solid state drive, comprising: a plurality of semiconductor devices having first surfaces and second surfaces opposed to the first surfaces; signal communication means affixed to the first surfaces of the plurality of semiconductor devices for transferring signals from the plurality of semiconductor devices to a host device; cover means affixed to the second surfaces of the plurality of semiconductor devices for sealing the plurality of semiconductor devices; and cooling means for providing removing heat from the plurality of semiconductor devices.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A solid state drive, comprising:
    a substrate comprising a plurality of contact pads;
    a plurality of semiconductor devices coupled to the substrate and arrayed in at least one of spaced apart rows or columns of semiconductor devices;
    a plurality of electrically conductive bumps on surfaces of the plurality of semiconductor devices, the plurality of electrically conductive bumps coupled to the plurality of contact pads;
    a plurality of cooling tunnels being defined by the at least one of spaced apart rows or columns of semiconductor devices, the plurality of cooling tunnels configured to receive a cooling fluid flowing through the cooling tunnels to carry heat away from the plurality of semiconductor devices, and a cooling tunnel of the plurality of cooling tunnels configured to vent the cooling fluid in an unconstrained egress to an environment surrounding the solid state drive.

2. The solid state drive of claim 1, wherein the plurality of semiconductor devices are electrically coupled to the substrate.

3. The solid state drive of claim 1, wherein the plurality of semiconductor devices are physically coupled to the substrate.

4. The solid state drive of claim 1, wherein the substrate is pliable to couple with variable heights of the surfaces of the plurality of semiconductor devices.

5. The solid state drive of claim 1, further comprising a cover affixed to surfaces of the plurality of semiconductor devices opposite to surfaces coupled to the substrate.

6. The solid state drive of claim 5, wherein the cooling tunnel of the plurality of cooling tunnels is bounded by the substrate, the cover and a pair of adjacent rows or columns of semiconductor devices.

7. The solid state drive of claim 1, wherein the plurality of cooling tunnels comprise first and second ends open to the environment surrounding the solid state drive, the solid state drive further comprising one or more fluid tubes extending through an exterior surface of the solid state drive into communication with the cooling tunnel between the first and second ends.

8. The solid state drive of claim 1, wherein the plurality of semiconductor devices each comprise a 3-D cube having a plurality of stacked semiconductor die.

9. A solid state drive, comprising:
    a substrate;
    a plurality of semiconductor devices having first sides coupled to the substrate, and second sides opposed to the first sides;
    a cover having a first surface facing an exterior of the solid state drive and exposed to an environment external to the solid state drive, and a second surface, opposite the first surface, directly affixed to the second sides of the plurality of semiconductor devices; and
    a plurality of cooling tunnels extending from a first edge of the solid state drive to a second edge of the solid state drive, a cooling tunnel of the plurality of cooling tunnels being defined by the substrate, cover, a first group of the plurality of semiconductor devices and a second group of the plurality of semiconductor devices, the plurality of cooling tunnels configured to receive a cooling fluid to remove heat from the plurality of semiconductor devices.

10. The solid state drive of claim 9, wherein the first and second groups of semiconductor devices form a pair of adjacent rows or columns extending between opposed edges of the solid state drive.

11. The solid state drive of claim 9 the first surfaces, further comprising a plurality of electrically conductive bumps on the first surfaces of the plurality of semiconductor devices, and further comprising a plurality of contact pads on the substrate, the plurality of electrically conductive bumps coupled to the plurality of contact pads.

12. The solid state drive of claim 11, wherein the substrate is pliable to couple with variable heights of the surfaces of the plurality of semiconductor devices.

13. The solid state drive of claim 9, further comprising fluid tubes extending through an exterior surface of the solid state drive into communication with the plurality of cooling tunnels.

14. The solid state drive of claim 13, wherein the fluid tubes are connected to one or more negative pressure sources for drawing fluid out of the solid state drive through the fluid tubes.

15. The solid state drive of claim 14, wherein the one or more negative pressure sources apply a uniform pressure across the fluid tubes.

16. The solid-state drive of claim 14, wherein the one or more negative pressure sources comprise at least a first and second pressure source, the first and second pressure sources exerting different pressures on the fluid tubes.

17. The solid-state drive of claim 9, wherein the cover is directly affixed to the second surfaces of the plurality of semiconductor devices.

18. A solid state drive, comprising:
    a substrate;
    a cover;
    a plurality of semiconductor devices directly affixed to the substrate and directly affixed to the cover, the semiconductor die arrayed in at least one of spaced apart rows and or columns of semiconductor devices;
    a plurality of cooling tunnels being defined by the at least one of spaced apart rows and or columns of semiconductor devices, the plurality of cooling tunnels configured to receive a cooling fluid flowing through the cooling tunnels to carry heat away from the plurality of semiconductor devices.

19. The solid state drive of claim 18, wherein the plurality of semiconductor devices are physically and electrically coupled to the substrate.

20. The solid state drive of claim 18, further comprising a plurality of electrically conductive bumps on surfaces of the plurality of semiconductor devices, and further comprising a plurality of contact pads on the substrate, the plurality of electrically conductive bumps coupled to the plurality of contact pads.

21. The solid state drive of claim 20, wherein the substrate is pliable to couple with variable heights of the surfaces of the plurality of semiconductor devices.

22. The solid state drive of claim 18, wherein a cooling tunnel of the plurality of cooling tunnels is bounded by the substrate, the cover and a pair of adjacent rows or columns of semiconductor devices.

23. The solid state drive of claim 22, wherein the cooling tunnel of the plurality of cooling tunnels being open to an environment surrounding the solid state drive.

24. The solid state drive of claim 18, further comprising fluid tubes extending through an exterior surface of the solid state drive into communication with the plurality of cooling tunnels.

25. The solid state drive of claim 18, wherein the plurality of semiconductor devices each comprise a 3-D cube having a plurality of semiconductor die.

26. A solid state drive, comprising:
a substrate;
a plurality of semiconductor devices coupled to the substrate and arrayed in at least one of spaced apart rows or columns of semiconductor devices, the plurality of semiconductor devices each comprising a 3-D cube having a plurality of stacked semiconductor dies;
a plurality of cooling tunnels being defined by the at least one of spaced apart rows or columns of semiconductor devices, the plurality of cooling tunnels configured to receive a cooling fluid flowing through the cooling tunnels to carry heat away from the plurality of semiconductor devices, and a cooling tunnel of the plurality of cooling tunnels configured to vent the cooling fluid in an unconstrained egress to an environment surrounding the solid state drive.

* * * * *